ature Patent [19]

Dockerty et al.

[11] 4,409,722
[45] Oct. 18, 1983

[54] BORDERLESS DIFFUSION CONTACT PROCESS AND STRUCTURE

[75] Inventors: Robert C. Dockerty, Wappingers Falls, N.Y.; Paul L. Garbarino, Ridgefield, Conn.

[73] Assignee: International Business Machines Corporation, Armonk, N.Y.

[21] Appl. No.: 182,722

[22] Filed: Aug. 29, 1980

[51] Int. Cl.³ .................. H01L 21/225; H01L 21/265
[52] U.S. Cl. .................................... 29/571; 29/576 B; 29/591; 148/187; 148/188
[58] Field of Search ...................... 29/571, 576 B, 591; 148/1.5, 187, 188

[56] References Cited

U.S. PATENT DOCUMENTS

| 3,387,286 | 6/1968 | Dennard | 340/173 |
| 3,967,981 | 7/1976 | Yamazaki | 148/175 X |
| 4,074,304 | 2/1978 | Shiba | 148/187 X |
| 4,157,269 | 6/1979 | Ning et al. | 148/1.5 |
| 4,160,991 | 7/1979 | Anantha et al. | 357/49 |
| 4,251,571 | 2/1981 | Garbarino et al. | 29/571 X |
| 4,317,274 | 3/1982 | Yasunari | 29/571 |
| 4,356,041 | 10/1982 | Kosa | 148/187 X |

OTHER PUBLICATIONS

Plisken, *IBM Journal of Research and Development*, vol. 10, No. 3, May 1966.

*Primary Examiner*—G. Ozaki
*Attorney, Agent, or Firm*—George O. Saile

[57] ABSTRACT

Electrical contacts to diffused regions in a semiconductor substrate are made by a process which reduces the space needed in memory or logic cell layouts. The contacts are made such that they overlap, but are insulated from, adjacent conductors. The contacts are formed in a manner which avoids shorting of the diffused junctions to adjacent structures without being limited by lithographic overlay tolerances.

7 Claims, 11 Drawing Figures

BORDERLESS DIFFUSION CONTACT PROCESS AND STRUCTURE

BACKGROUND OF THE INVENTION

This invention relates generally to the fabrication of integrated circuits and more particularly to a borderless contact structure and its method of manufacture.

In memory device structures, decreased cell size is a goal in order to obtain better performance and to permit more cells per chip. One constraint in decreasing memory cell size relates to the formation of electrical contacts to the device areas where lithographic overlay tolerances must be allowed in order to avoid shorting between the contacts and adjacent structures. For example, in an FET memory cell the spacing between the gate electrodes of adjacent cells and the diffused region must allow for the inability to precisely align a contact mask with the device areas in order to open contact holes through an insulating layer. A border 10 is required around contact area 11, as illustrated in FIG. 1, to assure the separation of the contact from the edges 12 of gate electrodes or word lines 13 and the edges 14 of field oxide regions 15. The edges 17 of electrodes 16 are also illustrated which are vertically separated from lines 13 by a dielectric layer. Border 10, having a width of about 1.5 microns, for example, represents wasted chip surface area. Processes have been devised to permit smaller emitter base spacing in bipolar devices, for example, U.S. Pat. No. 4,160,991 in which a polysilicon layer is used to contact the base area. The polysilicon layer is separated from a metal emitter contact layer by an insulating layer. The polysilicon layer overlays the field oxide and a metal contact to the polysilicon layer is formed through the insulating layer. U.S. Pat. No. 4,157,269 also concerns a process to permit smaller emitter base spacing in which contact to a polysilicon layer is made which is remote from the device regions.

We have now found a process which provides for borderless contacts for FET cells resulting in decreased cell size and performance advantages.

BRIEF SUMMARY OF THE INVENTION

In accordance with this invention, there is provided a method for forming borderless electrical contacts to a semiconductor device which is formed on a monocrystalline silicon substrate comprising the steps of:

providing, as part of the device, a gate structure which includes an insulating layer and a gate electrode of polycrystalline silicon;

subjecting the device to a thermal oxidation which results in a thicker silicon dioxide layer on the gate electrode than on the surface of the substrate where the contact is to be made;

etching the silicon dioxide layer from the surface of the substrate while etching only a portion of the thicker silicon dioxide layer; and forming an electrical contact layer of conductive material on the surface of the substrate and over the thicker silicon dioxide layer which remains on the gate electrode in a manner that the electrical contact layer is above at least a portion of the gate electrode.

The electrical contact layer can be extended to connect similar diffused regions of a series of, for example, memory cells in a memory array on a semiconductor chip or an insulating layer can be formed over the contact layer and contacts formed through the layer to the gate electrode and to the source and/or drain regions of a field effect transistor.

Where the electrical contact layer is doped polysilicon, it can be used as a diffusion source to form the source and/or drain regions. These regions can also be formed prior to applying the electrical contact layer by diffusion or ion implantation.

Also provided by the invention is a borderless electrical contact structure for an FET device which is formed on a silicon semiconductor substrate. The device has a gate structure with an insulating layer on the substrate and a gate electrode of polycrystalline silicon on the insulating layer. A diffused region is formed in the substrate adjacent to the gate. A silicon dioxide layer covers the top and sides of the gate electrode. An electrical contact layer of conductive material is in contact with the surface of the silicon substrate. The contact area on the substrate is substantially coextensive with, but smaller than the diffused source region so that it does not extend over the junction. The contact layer also extends over the silicon dioxide layer such that it is above at least a portion of the gate electrode. The term diffused region as used herein includes regions formed by ion implantation.

DETAILED DESCRIPTION

Figure 1:
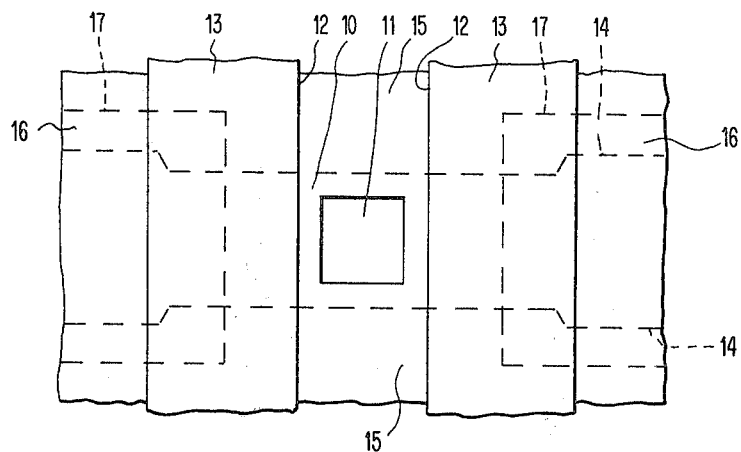
FIG. 1 is a plan view illustrating the layout of a contact structure according to the prior art.
Figure 2:
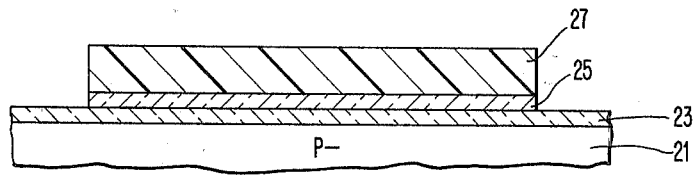
FIGS. 2 to 8 are schematic cross-sectional views illustrating the steps for forming a borderless contact structure in an FET device according to the process of the invention.
Figure 3:
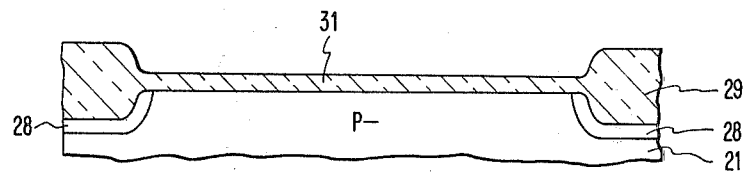
Figure 4:
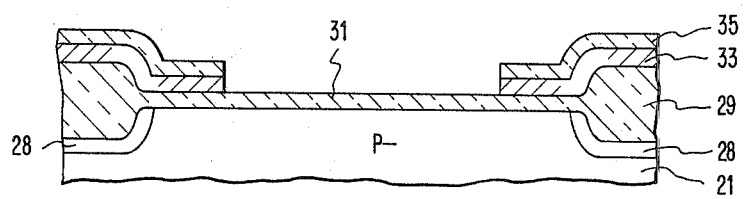
Figure 5:
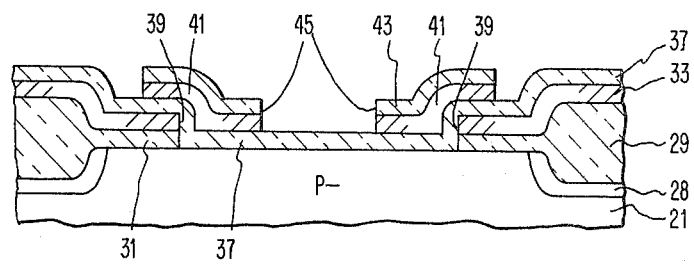
Figure 6:
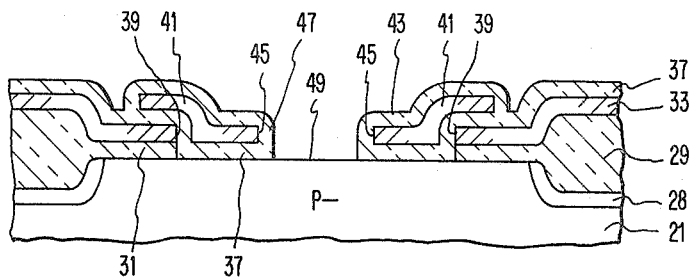

Turning now to FIGS. 2 to 9, a FET inversion storage memory cell having a borderless contact is formed. Onto a P-type monocrystalline silicon semiconductor substrate 21 is formed a thermal silicon dioxide layer 23 of about 300 to 400 Å in thickness followed by a 1000 Å thick layer 25 of chemical vapor deposited (CVD) silicon nitride. Silicon nitride layer 25 is patterned by standard lithography and etching techniques, using resist layer 27, to provide the structure shown in FIG. 2. A channel stop implant 28 is performed during which the resist layer 27 masks the boron implant. Resist layer 27 is stripped and field oxide regions 29 of about 6,000 Å in thickness are grown in steam at a temperature of about 1,000° C. The remaining nitride layer 25 is stripped in hot phosphoric acid, oxide layer 23 is removed in buffered hydrofluoric acid and silicon dioxide layer 31 is grown in dry oxygen at a temperature of about 950° C. to a thickness of about 500 Å to produce the structure shown in FIG. 3. A CVD polysilicon layer 33 is then deposited over the structure to a thickness of about 4,000 Å and a layer of phosphosilicate glass (PSG) is formed at the surface of layer 33 by an oxidation in an atmosphere of $POCl_3$. The structure is annealed at 950° C. in nitrogen to drive phosphorus into the polysilicon layer to provide conductive polysilicon electrode plates and the PSG layer is then stripped in buffered HF. A CVD silicon dioxide layer 35 is then deposited to a thickness of about 3,000 Å and patterned using a resist layer and etching with buffered HF. The exposed portions of polysilicon layer 33 are then etched through the opening in layer 35 by dry etching in a CF₄+O₂ plasma atmosphere or by wet etching with pyrocatechol to produce the structure of FIG. 4. The exposed portion of silicon dioxide layer 31 is etched through the opening in layer 33 with buffered HF and a 500 Å thick gate silicon dioxide layer 37 is grown on the exposed surface of substrate 21 and also on the sidewalls 39 and top of polysilicon layer 33 (FIG. 5). A second layer of doped polysilicon, to provide gate electrodes 41, is formed and patterned by repeating the above steps with the polysilicon layer being etched by reactive ion etching through overlying oxide layer 43 to give straight sidewalls 45 as shown in FIG. 5. The portion of silicon dioxide layer 37 between gate electrodes 41 is then etched from the surface of substrate 21 and the resulting structure is reoxidized in steam at a temperature of 800° C. to grow 500 Å of silicon dioxide on substrate 21 and 2,000 Å of silicon dioxide on the sidewalls 45 of the gate electrodes 41. This result is achieved due to the more rapid oxidation rate of the phosphorus doped polysilicon compared to the oxidation rate of the silicon substrate. Without need for any masking, the thin portion of this silicon dioxide layer is then removed from the surface portion 49 of the substrate while leaving at least about 1,500 Å of sidewall oxide 47 (FIG. 6) by using buffered HF or preferably by directional reactive ion etching in an atmosphere containing a mixture of CF₄ and hydrogen.

Figure 7:
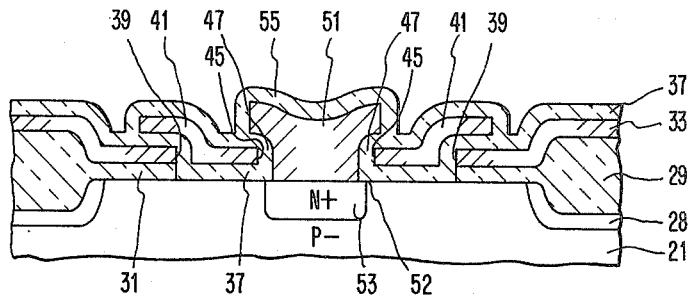
Figure 8:
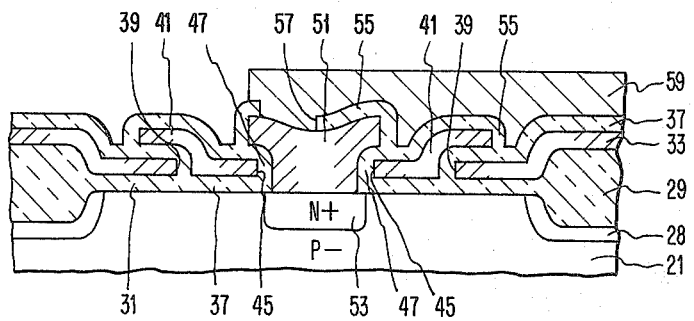

A third polysilicon layer 51 having a thickness of 4,000 to 8,000 Å is then blanket deposited by CVD and doped with phosphorus by oxidation in an atmosphere of POCl₃ followed by an anneal at a temperature of 950° C. for 45 minutes in nitrogen. The anneal also diffuses phosphorus into the surface of substrate 21 to form a self-aligned N+ diffused region 53 which is in electrical contact with polysilicon layer 51 with the junction 52 being under the oxide layer 47 due to lateral diffusion of the phosphorus (FIG. 7). The function of the diffused region 53 in a Dennard type memory cell is to operate as the bit line in a memory cell array as is well known in the art.

Figure 9:
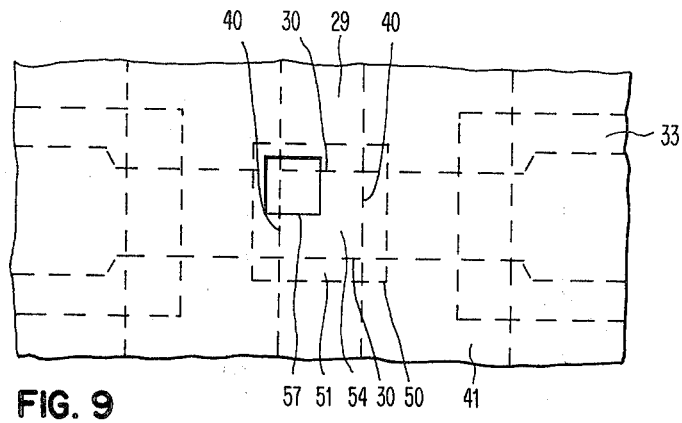
FIG. 9 is a plan view illustrating the layout of a borderless contact structure according to the invention.

Layer 51 is then patterned by standard lithographic techniques and dry or wet etching. Thermal silicon dioxide layer 55 is next grown in steam at a temperature of 800° C. Contact hole 57 is opened through layer 55 to polysilicon layer 51 using a resist mask. The resist is stripped and a layer 59 of metal, such as aluminum is deposited and patterned to form the electrical connection to layer 51. Because the edge 50 of layer 51 overlaps the edges 40 of layer 41 and the edges 30 of the field oxide 29, the contact hole 57 can be misaligned so that it also overlaps layer 41 and field oxide 29 as shown in FIG. 9 without causing shorting of the contact to either the substrate or to the gate electrode. This allows the spacing between the edges 40 of the gates 41 and the edges 30 of the field oxide 29 to be substantially the dimensions of the N+ contact region 54. Therefore, the contact structure of the invention is borderless in two dimensions. This results in a much more compact memory cell with the lithographic overlay tolerances being absorbed in the conductive polysilicon contact layer 51. For example, the spacing between the edges of the gate electrodes and similarly the edges of the field oxide regions need be only about 2 microns rather than the 6 microns required previously to account for overlay tolerances.

Figure 10:
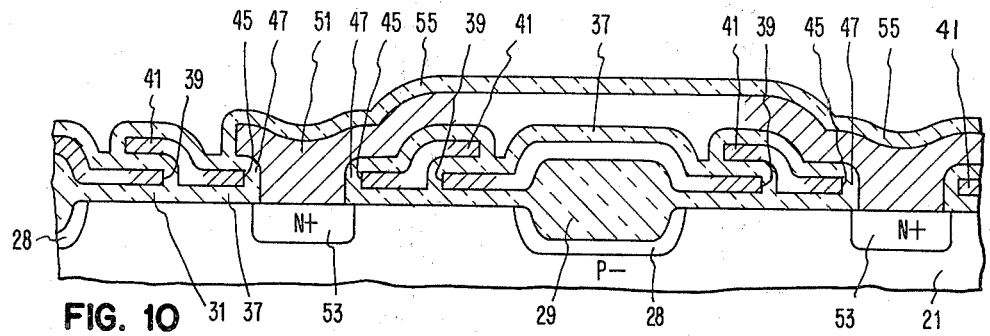
FIGS. 10 and 11 are schematic cross-sectional views illustrating alternate embodiments of the invention.
Figure 11:
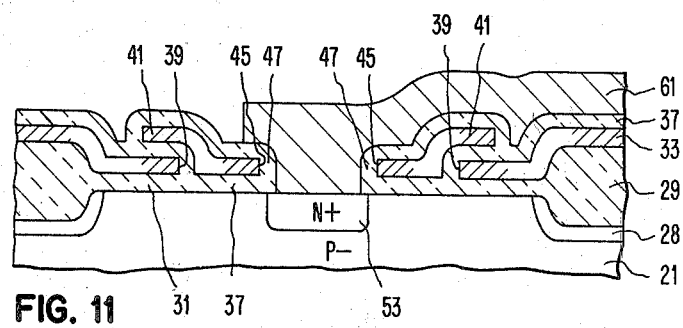

FIGS. 10 and 11 illustrate alternate embodiments of the invention. As shown in FIG. 10, the polysilicon contact layer 51 can be used to connect adjacent bit diffusion N+ regions 53 thus providing a polysilicon bit line in a memory array of cells of the type described, for example, by Dennard in U.S. Pat. No. 3,387,286.

Instead of using polysilicon as the diffusion source to provide N+ region 53, the region can be formed by the ion implantation of arsenic or phosphorus after the growth of silicon dioxide layer 47 (FIG. 6) and the removal of this thin oxide from the surface 49 of substrate 21. A polysilicon or a metal layer 61 (FIG. 11) metal such as aluminum is then deposited to provide electrical contact to region 53.

We claim:

1. A method of making an electrical contact to a semiconductor device which is formed on a silicon substrate comprising the steps of:
   providing as part of said device a gate structure including an insulating layer and a gate electrode of doped polycrystalline silicon;
   forming in the formation of two parallel gates an opening through said insulating layer and gate electrode to said substrate in the area designated to be a self-aligned diffused region;
   subjecting said device to a thermal oxidation which results in a thicker silicon dioxide layer on said gate electrodes than on the surface of said substrate where said contact is to be made;
   etching said silicon dioxide layer from said surface while etching only a portion of said thicker silicon dioxide layer; and
   forming an electrical contact layer of conductive material on said surface and over said thicker silicon dioxide layer wherein said electrical contact layer is above at least a portion of said gate electrode.

2. The process of claim 1 including the steps of:
   forming an insulating layer on said layer of conductive material; and
   forming contacts through said insulating layer to said gate electrode and to said layer of conductive material.

3. The process of claim 1 wherein said insulating layer is silicon dioxide and said electrical contact layer is doped polycrystalline silicon.

4. The process of claim 3 wherein said substrate is P type silicon and including the steps of doping the polycrystalline silicon of said contact layer with phosphorus and then annealing to diffuse phosphorus into said substrate to from an N+ region in said substrate adjacent to said gate.

5. The process of claim 1 wherein the contact is to a region formed by either ion implantation or diffusion after said etching said silicon dioxide layer.

6. The process of claim 1 wherein the contact is to a region formed by ion implantation before said etching said silicon dioxide layer and said conductive material is metal or doped polysilicon.

7. The method of claim 1 wherein said silicon substrate is P− type, said gate electrode of polycrystalline silicon is N type, and said etching is done by directional reactive ion etching.

* * * * *